(12) United States Patent
Chan et al.

(10) Patent No.: US 11,430,697 B2
(45) Date of Patent: Aug. 30, 2022

(54) METHOD OF FORMING A MASK LAYER

(71) Applicant: IMEC vzw, Leuven (BE)

(72) Inventors: Boon Teik Chan, Wilsele (BE); Zheng Tao, Heverlee (BE); Efrain Altamirano Sanchez, Kessel-Lo (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/843,706

(22) Filed: Apr. 8, 2020

(65) Prior Publication Data

US 2020/0328122 A1    Oct. 15, 2020

(30) Foreign Application Priority Data

Apr. 9, 2019  (EP) .................................... 19168018

(51) Int. Cl.
| | | |
|---|---|---|
| *H01L 21/8234* | (2006.01) | |
| *H01L 21/027* | (2006.01) | |
| *H01L 29/66* | (2006.01) | |
| *H01L 21/033* | (2006.01) | |

(52) U.S. Cl.
CPC .... *H01L 21/823431* (2013.01); *H01L 21/027* (2013.01); *H01L 21/0337* (2013.01); *H01L 29/66795* (2013.01)

(58) Field of Classification Search
CPC ............ H01L 21/0334; H01L 21/0337; H01L 29/7843; H01L 29/7848; H01L 29/66795; H01L 29/785; H01L 21/823431; H01L 21/027
See application file for complete search history.

(56) References Cited

U.S. PATENT DOCUMENTS

| | | | |
|---|---|---|---|
| 8,110,466 B2 * | 2/2012 | Shieh .............. | H01L 21/823431 |
| | | | 438/268 |
| 8,932,955 B1 | 1/2015 | Sel et al. | |
| 9,123,656 B1 | 9/2015 | Hsieh et al. | |
| 9,530,772 B1 * | 12/2016 | Balakrishnan .... | H01L 21/32139 |
| 9,679,809 B1 | 6/2017 | Kye et al. | |
| 9,741,821 B1 | 8/2017 | Ching et al. | |
| 2005/0070103 A1 * | 3/2005 | Deshmukh ........ | H01L 21/31122 |
| | | | 438/689 |
| 2007/0049011 A1 * | 3/2007 | Tran .................... | H01L 21/0338 |
| | | | 438/637 |

(Continued)

OTHER PUBLICATIONS

Extended European Search Report for Application No. EP 19 168 018.0 dated Oct. 14, 2019 in 7 pages.

*Primary Examiner* — Tuan A Hoang
(74) *Attorney, Agent, or Firm* — Knobbe, Martens, Olson & Bear, LLP

(57) ABSTRACT

A method for forming a mask layer above a semiconductor fin structure is disclosed. In one aspect the method includes forming a first set of spacers and a second set of spacers arranged at the side surfaces of the first set of spacers, providing a first filler material between the second set of spacers, etching a top portion of the first filler material to form recesses between the second set of spacers, and providing a second filler material in the recesses, the second filler material forming a set of sacrificial mask lines. Further, the method includes recessing a top portion of at least the first set of spacers, providing a mask layer material between the sacrificial mask lines, and removing the sacrificial mask lines and the first filler material.

17 Claims, 7 Drawing Sheets

(56) References Cited

U.S. PATENT DOCUMENTS

| | | | | |
|---|---|---|---|---|
| 2011/0175169 | A1* | 7/2011 | Cheng | H01L 21/823807 |
| | | | | 257/369 |
| 2013/0157462 | A1* | 6/2013 | Lee | H01L 21/3086 |
| | | | | 438/685 |
| 2014/0110817 | A1* | 4/2014 | Bergendahl | H01L 21/3088 |
| | | | | 438/689 |
| 2014/0239462 | A1* | 8/2014 | Shamma | G03F 7/11 |
| | | | | 257/637 |
| 2015/0311082 | A1* | 10/2015 | Bouche | H01L 29/785 |
| | | | | 257/288 |
| 2018/0308753 | A1* | 10/2018 | Mosden | H01L 29/66545 |
| 2019/0013396 | A1* | 1/2019 | Wang | H01L 21/823821 |
| 2019/0131131 | A1* | 5/2019 | Wu | H01L 21/76802 |
| 2019/0189914 | A1* | 6/2019 | Miyazoe | H01L 21/28 |
| 2020/0328082 | A1* | 10/2020 | Ko | C23C 14/225 |

* cited by examiner

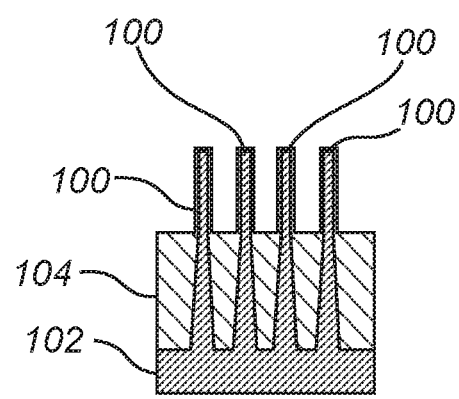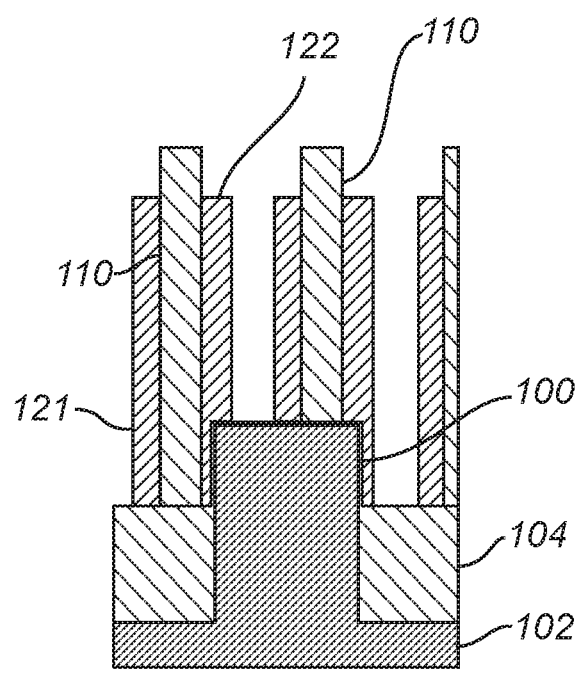
Fig. 3A          Fig. 3B
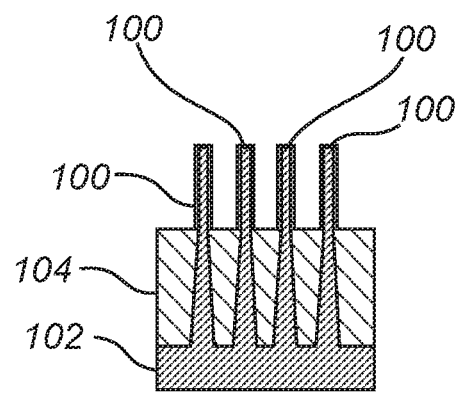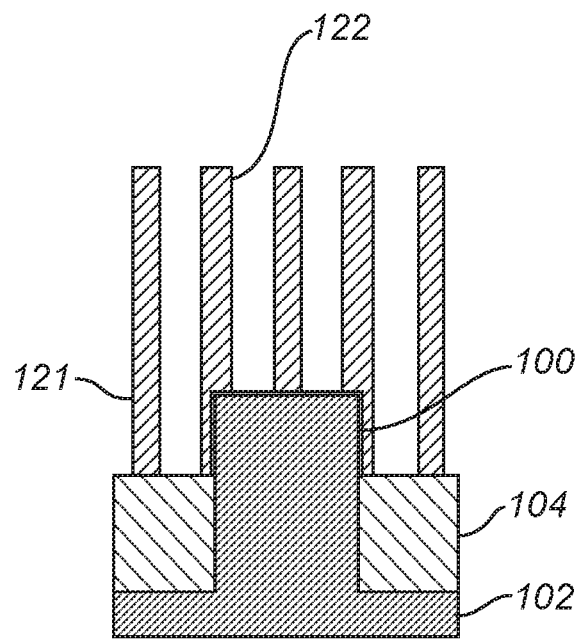
Fig. 4A          Fig. 4B

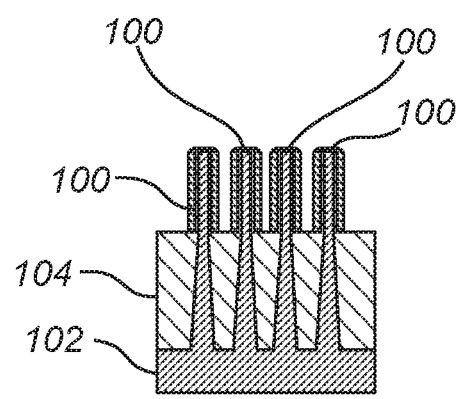 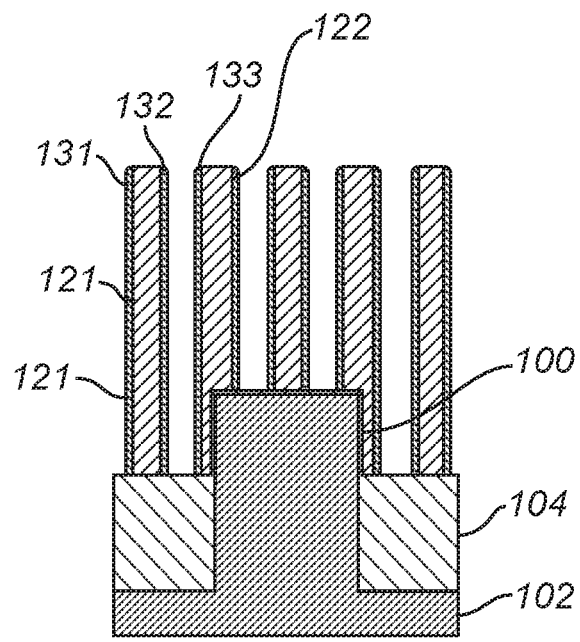
Fig. 5A  Fig. 5B
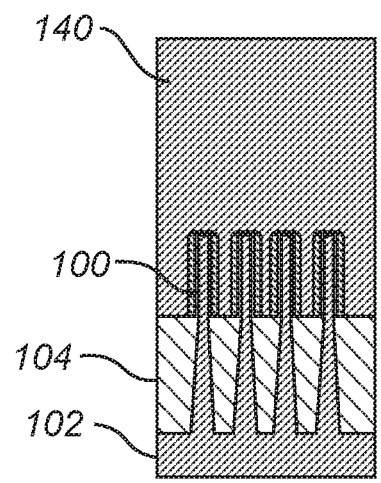 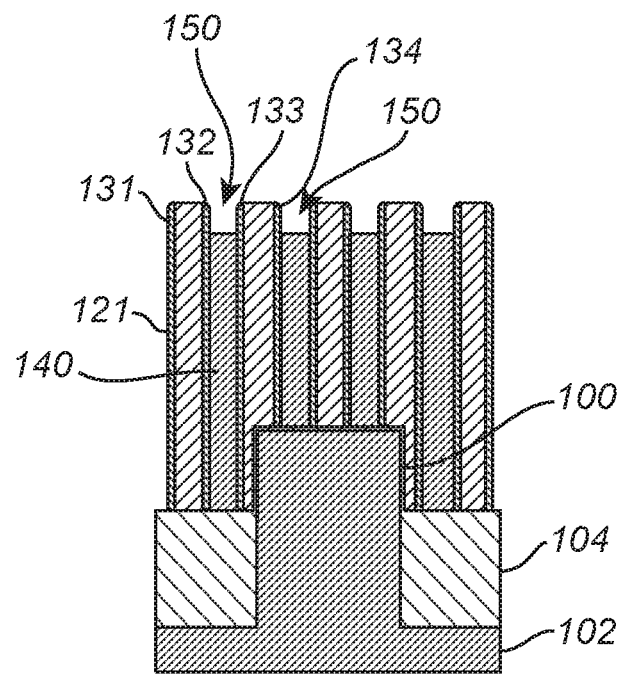
Fig. 6A  Fig. 6B

METHOD OF FORMING A MASK LAYER

CROSS-REFERENCE TO RELATED APPLICATIONS

This application claims foreign priority to European Application No. EP 19168018.0, filed Apr. 9, 2019, the content of which is incorporated by reference herein in its entirety.

BACKGROUND

Technological Field

The disclosed technology generally relates to the field of semiconductor processing. More particularly, the disclosed technology relates to a method for forming a mask layer above a semiconductor fin structure.

Description of the Related Technology

A transistor device, such as a field effect transistor (FET), has a source, a channel, and a drain, where current flows from the source to the drain through the channel, and a gate structure controls the flow of current through the channel. Transistor devices can have a variety of different structures. For example, some transistor devices can be of a planar type with the source, channel, and drain formed in the substrate material itself, while other transistor devices can be of a type in which the channel extends outward from the substrate. In some transistor devices of the latter type, the channel can be an upright slab of thin material, commonly referred to as a fin, with a crossing gate structure arranged on the fin so as to control the flow of current along the fin, in the direction of a main surface of the substrate.

Decreasing device dimensions in the semiconductor industry have increased the difficulty in forming individual components and features. Ever smaller patterning techniques are needed to continue to form components and features with smaller device dimensions. There remains a demand for improved processing for reduced feature sizes which may beneficially improve gate pitch scaling, footprint reduction, and process reliability.

SUMMARY OF CERTAIN INVENTIVE ASPECTS

An objective of the present inventive concept is to provide a method for forming a mask layer above a semiconductor fin structure. Further and/or alternative objectives may be understood from the following.

According to an aspect of the present disclosed technology there is provided a method for forming a mask layer above a semiconductor fin structure. The method includes: forming a mandrel above the fin structure, providing a first spacer material on the mandrel, thereby forming a first set of spacers including a first spacer at a first side surface of the mandrel and a second spacer at a second side surface of the mandrel, removing the mandrel, providing a second spacer material on the first and the second spacers, thereby forming a second set of spacers arranged at the side surfaces of the first set of spacers, providing a first filler material between the second set of spacers, a top portion of the first filler material to form recesses between the second set of spacers, providing a second filler material in the recesses, the second filler material forming a set of sacrificial mask lines, recessing a top portion of at least the first set of spacers, providing a mask layer material between the sacrificial mask lines, and removing the sacrificial mask lines and the first filler material.

Advanced gate patterning may include multiple patterning processes referred to in the industry as self-aligned double patterning (SADP) or self-aligned quadruple patterning (SAQP) for defining the gate critical dimension (CD). The present disclosed technology makes use of a different approach, in which a similar gate CD may be provided without necessarily employing a multiple patterning process. Instead, the mandrel can be formed in a direct patterning process and the gate CD defined by the first set and second set of spacers that are positioned using the mandrel. Advantageously, the same gate CD may be provided without using a multiple patterning process, thereby making further scaling feasible.

Further, the disclosed technology allows for the mask layer to be provided after the first and second set of spacers have been formed. This is advantageous over multiple patterning techniques such as SADP and SAQP that tend to use the same hard mask both for the multiple patterning process and the final gate mask layer, since the hard mask in those cases may be damaged or over-etched during the recessing of the spacer. By instead forming the final mask layer after the processing of the first and second set of spacers, the mask layer may be designed without taking process requirements related to the forming of the spacers into account. Instead, the mask layer may be engineered with respect to requirements associated with subsequent processing of the gate structures, such as for example replacement sacrificial gate processing. In particular, the mask layer may be adapted to have an improved etch resistance and/or be an improved chemical-mechanical polishing (CMP) stopping layer.

The fin structure may be a fin-shaped semiconductor structure extending along and protruding above a substrate. Even though the present aspect mentions a single semiconductor fin structure, it is appreciated that the disclosed technology may be also applicable to a plurality of semiconductor fin structures, such as a first fin structure and a second fin structure. The first fin structure may extend along a first fin track (e.g., a first geometrical straight line along the substrate). The second fin structure may extend along a second fin track (e.g., a second geometrical straight line along the substrate). The first fin structure and the second fin structure may extend in parallel to each other.

One or several transistor devices can be formed in the fin structure. Such a transistor device may for example be a field-effect transistor (FET) or a finFET, having a source region and a drain region formed in the fin and a horizontal channel in between.

As described herein, a mandrel refers to a core or feature that may be used as support for subsequent growth or deposition of the first spacer material. The mandrel may be formed in a single patterning step using a same mask, or in a multiple patterning process using several sub-masks. The patterning may be performed on a mandrel material layer that is formed above the fin structure. The mandrel material layer may be arranged directly on the fin structure or on an intermediate layer. In some embodiments, the mandrel may be oriented across the fin structure, such as substantially orthogonal, thereby allowing the final gate structures to be formed across the fin structure. A mandrel may be a sacrificial material used for patterning an underlying substrate, and therefore may be subsequently removed.

The first set of spacers may be formed by depositing the first spacer material over the mandrel and etching the deposited first spacer material such that the first spacer material remains at least on part of the side surfaces of the mandrel, thereby forming the first set of spacers. In some embodiments, the first set of spacers are deposited as a conformal layer. The etch may for example be anisotropic, leaving the first spacer material on the side surfaces of the mandrel.

The second set of spacers may be formed in a similar way, e.g., by depositing the second spacer material over the first set of spacers (after removal of the mandrel). The second spacer material may be deposited as a conformal layer, and etched such that the second spacer material remains at least on part of the side surfaces of the first set of spacers.

The first spacer material and the second spacer material may be etch-selective relative each other, such that for example the first spacer material can be etched away while the second spacer material is preserved.

A mask layer may be a layer that is capable of counteracting etching in regions covered by the layer. Regions exposed by the etch mask may accordingly be etched while regions covered by the etch mask may not be etched. Additionally, a mask layer may be understood as a pattern or structure that allows features to be defined in a subsequent processing step in which a material is added by means of for example growth or deposition. Regions exposed by the mask layer may be provided with the added material, while the covered regions may be protected from the added material. The mask layer formed in the method according to the disclosed technology may define a plurality of line-shaped gaps in which for example sacrificial gates or metal gates may be provided.

A material may be etch-selective relative to another material. By etching or removal of a feature A selectively to a feature B and thus a feature A arranged adjacent to a feature B may be removed while preserving the feature B. This may be achieved by covering the feature B to be preserved by an etch mask. This may also be achieved by exposing the features A and B to an etch process where the feature A is etched at a greater rate than the feature B. Hence, portions of the feature A exposed to the etching process may be removed while portions of the feature B exposed to the etch process may be preserved. The preservation of the feature B following the etch process may be complete such that the feature B is not appreciably affected during the etch process or at least partial such that the feature B remains at least to the extent that it may serve its intended function during subsequent process steps. A ratio of an etch rate of the material of feature A to feature B may advantageously be 2:1 or higher, 10:1 or higher, or 40:1 or higher.

"Above" may be a relative position as viewed in a normal direction from the main surface of the substrate. The terminology "above" may not refer to an absolute orientation of the layers or features, but to a relative ordering thereof. Accordingly, "side" or "side surface" may refer to a surface or surface portion facing in a direction along the main surface of the substrate. Put differently, the term "side surface" may have a normal direction that is orthogonal to the normal direction from the main surface of the substrate.

In some embodiments, the mandrel may be formed by a carbon based material, such as for example a spin-on carbon (SoC), photoresist, bottom antireflective coating (BARC), or Advanced Patterning Film (APF™) by Applied Materials, Inc. These types of materials may be advantageous over for example silicon-based materials, since they may be better suited for high-aspect-ratio patterning and may allow for etching while maintaining a relative straight profile of the resulting mandrel. SoC may be particularly advantageous in that it allows for a planarization, in which the fin topography may be polished and flattened by a suitable planarization technique such as chemical mechanical polishing (CMP). APF™, on the other hand, may withstand higher temperatures compared to for example SoC, BARC, and photoresist.

In some embodiments, the first spacer material may be deposited by a suitable deposition technique, e.g., a conformal deposition technique such as an atomic layer deposition (ALD) process. The first spacer material may for example be amorphous silicon (a-Si). ALD may be advantageous over for example chemical vapour deposition (CVD), since it allows for deposition of a conformal material and high layer deposition control. CVD may generate more voids and irregularities in the deposited material than ALD.

In some embodiments, the step of providing the first spacer material may be followed by an etch-back process for removing the first spacer material that has been deposited on the fin structure. This may be performed in an etch process that removes the first spacer material provided on top of and between the first set of spacers, while leaving at least some of the first spacer material on the side surfaces of the first spacer and the second spacer.

In some embodiments, the second spacer material may include a material that is etch selective relative to the first spacer material. The second spacer material may for example be a dielectric material such as silicon nitride, or a low-k dielectric such as SiCO or SiOCN. The second spacer material may be provided after the mandrel has been stripped or removed, such that the second set of spacers are formed at the side surfaces of the first set of spacers. In a subsequent step, the second spacer material may be etched-back to remove the second spacer material from the fin structure, leaving the second spacer material as spacers on the first set of spacers.

At this stage of the process, a set of mask lines or gaps may be provided, wherein the thickness of the mask lines may be determined by the thickness and separation of the first set of spacers and by the thickness of the second spacer material deposited on the sides of the first set of spacers. The width of the gaps may determine the width or lateral dimension of the final gate line which may be defined by the mask layer.

In some embodiments, a first filler material may be provided between the second set of spacers and may be a carbon based material similar to the one discussed above in connection with the material of the mandrel.

The first filler material may be etched back so as to allow recesses to be formed between the second set of spacers. These recesses may then be filled with a second filler material thereby forming the set of sacrificial mask lines. In some embodiments, the second filler material may be silicon dioxide. A top portion of the first filler material may be removed, the size of the top portion determining the height of the sacrificial mask lines and thus the thickness of the final mask layer.

In some embodiments, not only the first set of spacers but also the top of the second set of spacers may be recessed prior to providing the mask layer material between the sacrificial mask lines. As a result, the mask layer may protect not only the underlying first set of spacers but also the second set of spacers arranged on the side surfaces of the first set of spacers. The mask layer may for example include $SiO_2$, $Si_3N_4$, SiCO, or SiOCN. The mask layer may include a metal or metal oxide such as titanium nitride, titanium dioxide, or hafnium dioxide.

The present inventive concept may be employed in replacement or sacrificial gate processing, in which a sacrificial structure of for example oxide or nitride may serve in place of the metal gate during high-temperature steps. After completion of those steps, which for example may include source/drain implant activation anneals, the sacrificial structure may be etched away, a gate dielectric grown or deposited, and the final metal gate deposited in the gate tracks defined between the spacers of the second set of spacers.

BRIEF DESCRIPTION OF THE DRAWINGS

The above, as well as additional objects, features and advantages of the present disclosed technology, will be better understood through the following illustrative and non-limiting detailed description, with reference to the appended drawings. In the drawings like reference numerals will be used for like elements unless stated otherwise.

FIGS. 1a, 1b, 2a, 2b, 3a, 3b, 4a, 4b, 5a, 5b, 6a, 6b, 7a, 7b, 8a-8d, 9a-d, and 10a-10d schematically illustrate intermediate structures at various stages of a method of forming a mask layer above a semiconductor fin structure, according to one or more embodiments of the disclosed technology.

Figure 1A:
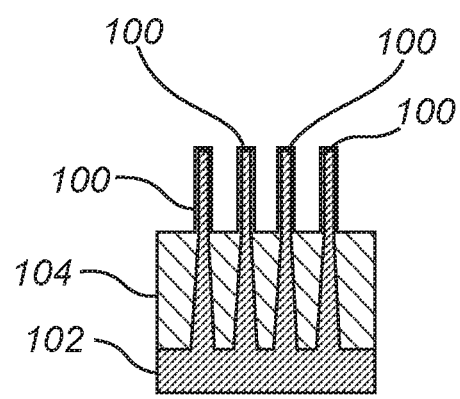

As illustrated in the figures, the sizes of the layers, features and other structures may be exaggerated or not depicted proportionally for illustrative purposes. Thus, the figures are provided to illustrate the general elements of the embodiments.

In the drawings, like reference numerals will be used for like elements unless stated otherwise.

DETAILED DESCRIPTION OF CERTAIN ILLUSTRATIVE EMBODIMENTS

With the ever decreasing device dimensions in the semiconductor industry, forming individual components and features is becoming more difficult. In the field of photolithography, a technique sometimes referred to as self-aligned double patterning (SADP) has been employed to form patterns of line widths that may go beyond, e.g., defining patterns having features sizes smaller than the resolution provided by conventional photolithography. SADP employs a technique called pitch splitting, in which the pattern is divided into two or more parts that can be processed conventionally and combined into a final, sub-resolution pitch pattern. The SADP approach may be used for providing fin-transistor gate structures having a reduced critical dimension.

A method for forming a mask layer will now be described with reference to the appended drawings, wherein the "a" figures generally show cross-sections taken across the fin structure and the "b" figures generally show cross-sections taken along the fin structure.

Figure 1B:
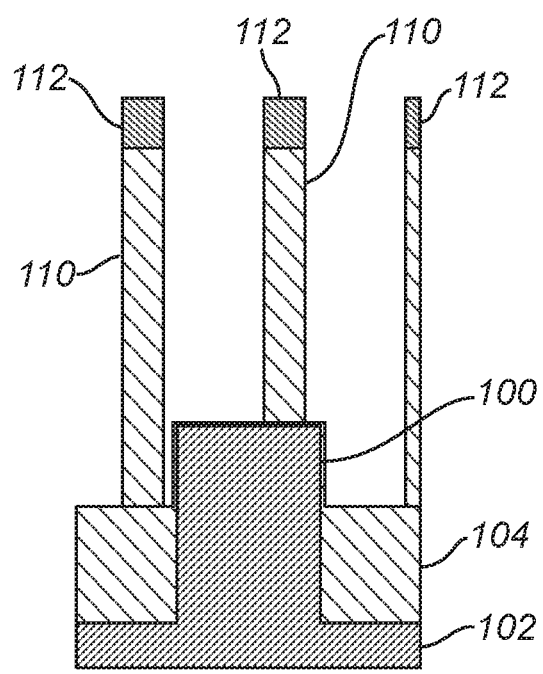

A cross section taken across a plurality of fin structures 100 is disclosed in FIG. 1a. FIG. 1b is a cross section taken along one of the fin structures 100. In the following, features of the inventive concept will be discussed with reference to both FIG. 1a and FIG. 1b.

Each of the fin structures 100 may be arranged on a substrate 102, the substrate 102 having a main surface extending along a plane coinciding with a length direction of the fin structures 100. The fin structures 100 may for example be formed by patterning of the substrate 102 and/or by means of epitaxial growth. The substrate 102 and the fin structures 100 may, for example, comprise or be formed of silicon. As indicated in FIG. 1a, an isolating layer 104, such as a shallow trench isolation, may be provided on the substrate 102 such that only an upper part of the fin structures 100 protrudes above a top surface of the isolating layer 104.

A mandrel 110 may be provided above the fin structures 100. The mandrel may be formed as a core or elongated feature extending across the fin structures 100, in a transversal direction coinciding with the orientation of the gate tracks of the final device (not shown in the present figures). The mandrel 110 may be formed by a spin-on deposited carbon-based material, such as for example spin-on carbon (SoC) or Advanced Patterning Film (APF™) from Applied Materials, Inc. One or several mandrels 110 may be provided; the number depending on the desired mask pattern to be formed. In the example shown in present FIG. 1b, three mandrels are indicated. The mandrels 110 may be formed in a direct patterning process, in which a single lithographic step may be used, or in a multiple patterning process such as the previously described SADP and SAQP examples. FIGS. 1a and 1b show an example in which a hard mask layer 112 has been used to define the mandrels 110. The hard mask layer 112 may for example be formed of amorphous silicon, a-Si.

In the current, illustrative example, four fin structures 100 are shown, of which the upper 50 nm may protrude from the isolation 104 on the substrate. The protruding part may also be referred to as the active region of the fins 100, in which the resulting transistor device may be formed. Each fin may in some examples have a width of 5-10 nm and be arranged next to each other, in a parallel fashion, at a pitch of for example 21-30 nm.

Turning to the mandrels 110, the current example discloses three mandrels 110 arranged in a way that allows for mask layer to be formed, defining four gate tracks—two across the fin structures 100, and one on each side of the fin structures 100 (as seen in the length direction of the fins 100). This configuration, which merely is to be regarded as an illustrative example of what may be enabled by the inventive concept, allows for a target gate line critical dimension (CD) of 16 nm, given a spacer width of 6 nm, a gap/trench width of 14 nm and a total gate pitch of 42 nm.

Figure 2A:
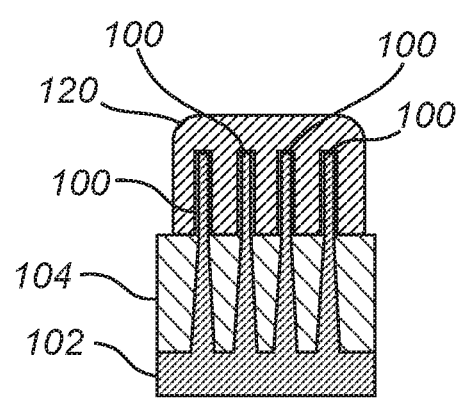
Figure 2B:
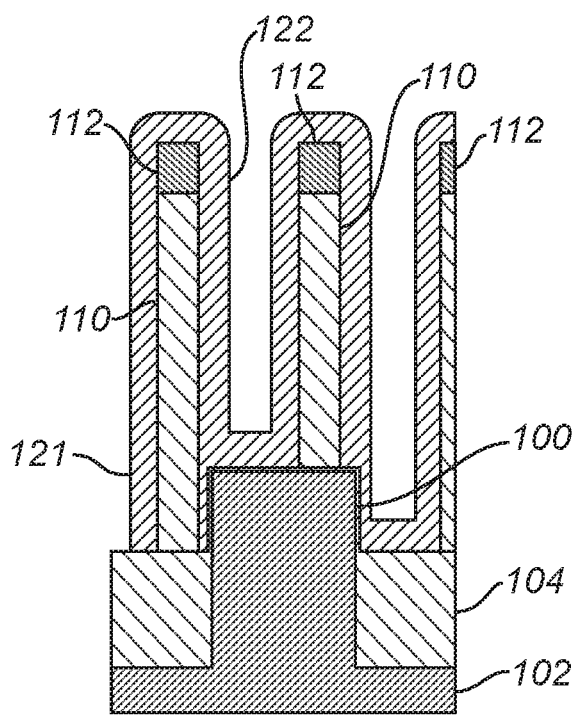

FIG. 2a shows a cross section of the structure of FIGS. 1a and 1b, taken across the fin structures 100 at a position between two neighbouring mandrels 110 after a first spacer material 120 has been provided. FIG. 2b shows a cross section of the structure of FIGS. 1a and 1b, taken along the one of the fin structures 100. The first spacer material 120 may be deposited as a conformal layer covering the entire mandrels 110. In one example, the first spacer material may be amorphous silicon deposited by means of atomic layer deposition (ALD). It will be appreciated that the first spacer material 120 can be provided directly on the mandrel material, or indirectly with an intermediate layer in between.

The deposition method, in which the first spacer material 120 is provided, may result in a conformal deposition of the material not only on the mandrels 110 but also on the fin structures 100. Therefore, the step of providing the first spacer material 120 may be followed by an etch-back process to remove the first spacer material from the fin structures 100. The result is shown in FIGS. 3a and 3b, after the first spacer material 120 has been etched by for example an anisotropic etch to define a first set of spacers, including a first spacer 121 on a first side surface and a second spacer 122 on a second side surface of each one of the three mandrels 110 shown in the present example.

The separation between the mandrels 110 in the current example may together with the thickness of the first spacer material 120, forming the first set of spacers, be selected such that a gap is defined between the spacers of adjacent mandrels 110. Preferably, the width of the gap is selected to correspond to the width of the mandrels 110, such that the first set of spacers are arranged in an equidistant configuration.

FIGS. 4a and 4b show the first set of spacers 121, 122 after the mandrels 110 have been removed. The mandrels 110 may for example be removed, e.g., selectively removed against the first set of spacers, by a plasma stripping process or ashing process. As mentioned above, the thickness and separation of the mandrels 110 may be selected such that the first set of spacers 121, 122 are provided with a constant separation.

In FIGS. 5a and 5b, a second spacer material 130 have been provided on the first set of spacers 121, 122. The second spacer material 130 may be provided directly on the first set of spacers 121, 122 or indirectly, with an intermediate layer in between. In case the second spacer material 130 is formed as a conformal layer covering all surfaces of the first set of spacers 121, 122 the forming of the layer may be followed by an etch-back process so as to define the second set of spacers. The etch-back process may for example involve an anisotropic etch process similar to the one discussed above for the definition of the first set of spacers 121, 122.

The result in shown in FIGS. 5a and 5b, in which the side surfaces of the first and second spacers 121, 122 has been provided with a respective spacer forming the second set of spacers 131, 132, 133, 134. The second set of spacers 131, 132, 133, 134 may for example be formed of a dielectric material, such as silicon nitride, or a low-k spacer such as SiCO.

In a subsequent step, the gaps between the second set of spacers 131, 132, 133, 134 may be filled with a first filler material 140. The first filler material 140, which for example may comprise a spin-on carbon material similar to the one discussed in connection with the mandrels, may be etched-back, e.g., selectively etched back using an ashing process, to form recesses 150 between the second set of spacers 131, 132, 133, 134. As shown in FIGS. 6a and 6b, the recesses 150 may be provided at the very top portion of the second set of spacers 131, 132, 133, 134. Due to the geometrical shape of the second set of spacers 131, 132, 133, 134, the recesses 150 that extend in between may be trenches that extend along the spacers. As will be shown later on, the depth of the recesses 150 may determine the thickness of the final mask structure.

Figure 7A:
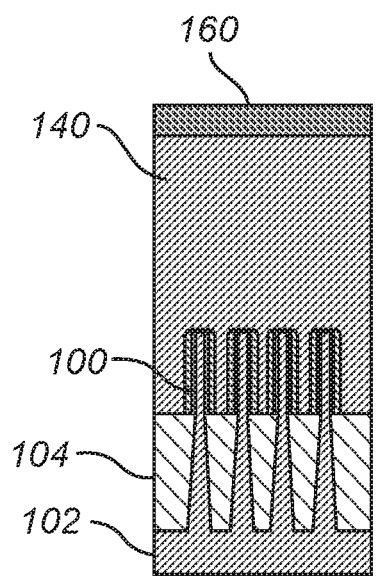
Figure 7B:
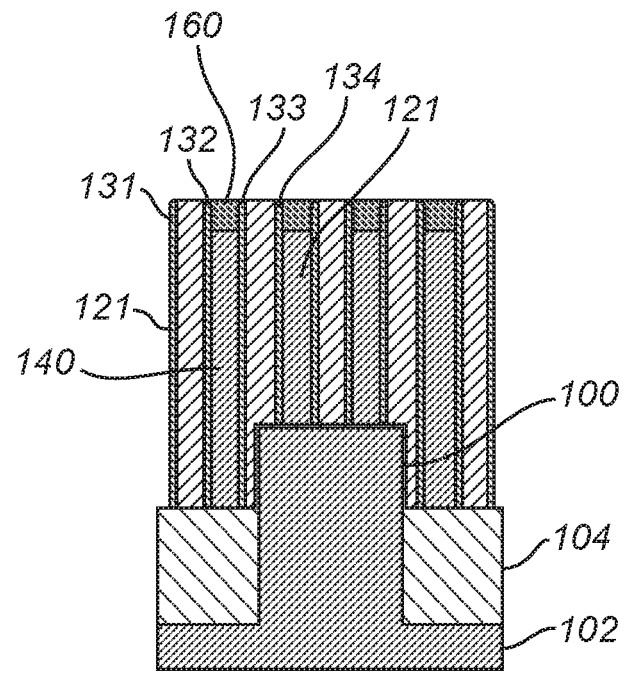

In FIGS. 7a and 7b, a second filler material 160, such as for example silicon dioxide, has been provided in the recesses 150. The second filler material may be deposited on top of the structure shown in FIGS. 7a and 7b and polished, e.g., by means of for example CMP to expose the top surfaces of the first and second set of fins. The second filler material 160 that is provided in the recesses 150 may form sacrificial mask lines, which may be used later on for defining the mask lines of the final mask layer.

FIGS. 8a-8d, 9a-9d and 10a-10d illustrate steps for forming the final mask layer above the semiconductor fin structures 100. Two alternative example flows will be given; the first flow in the "a" and "b" figures, and the alternative flow in the "c" and "d" figures.

Figure 8A:
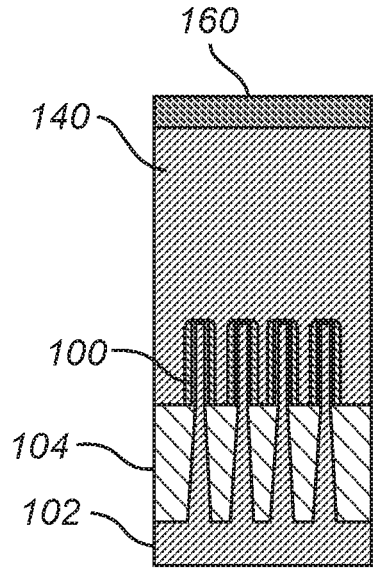
Figure 8B:
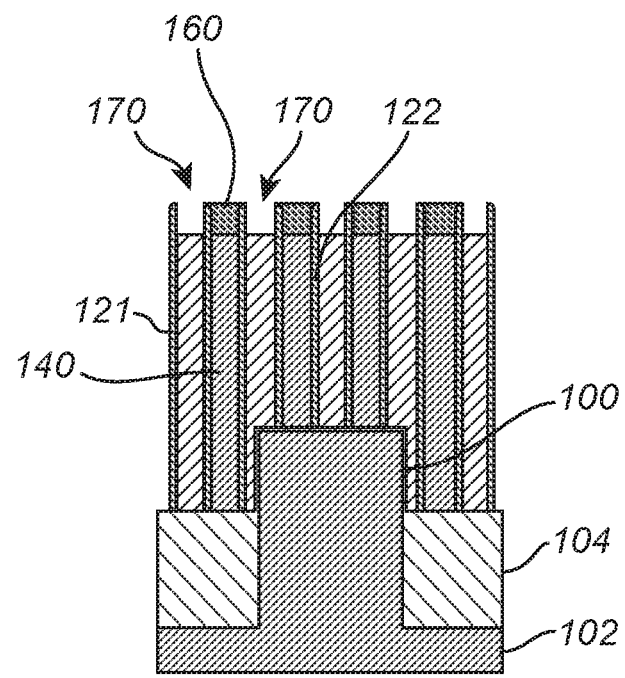

After the second filler material 160 has been provided to form the sacrificial mask lines, a top portion 170 of at least the first set of spacers 121, 122 may be recessed to form trenches extending along the spacers. In FIGS. 8a and 8b, the material of the first set of spacers 121, 122 is selectively etched with respect to the material of the second set of spacers 131, 132, 133, 134, such that the top portions 170 of the second set of spacers 131, 132, 133, 134 are preserved. When the first spacer material is amorphous silicon and the second spacer material is silicon nitride, the first spacer material of amorphous silicon may be selectively etched with respect to the neighbouring second spacer material of silicon nitride.

Figure 8C:
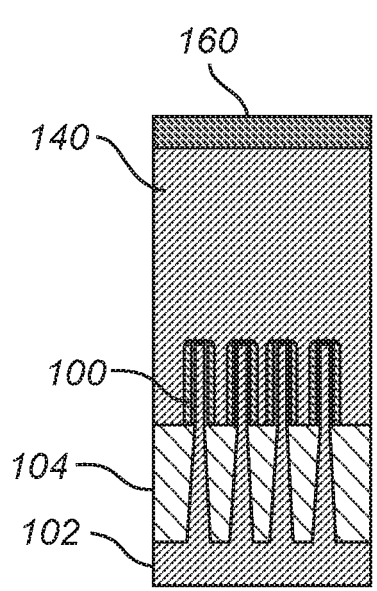
Figure 8D:
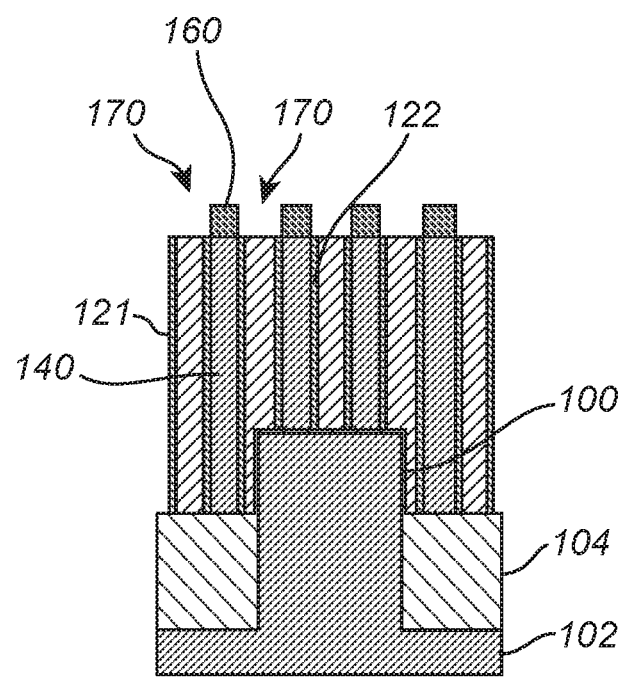

In FIGS. 8c and 8d, also the second spacer material is etched such that the recessing includes the top portions 170 of both the first set of spacers 121, 122 and the second set of spacers 131, 132, 133, 134. Preferably this is done in a single etch process that is capable of etching both materials, such as for example amorphous silicon and silicon nitride. Alternatively, two different etch processes may be used.

Figure 9A:
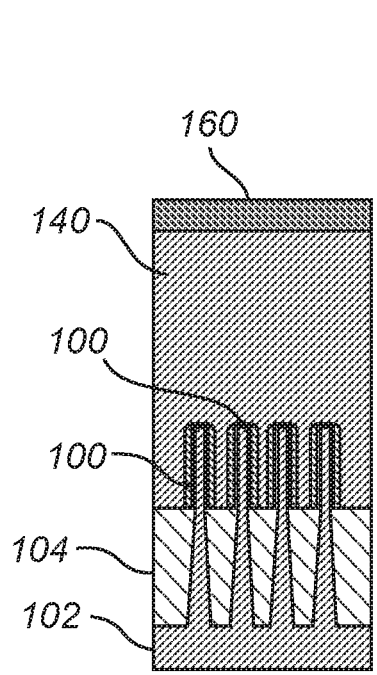
Figure 9B:
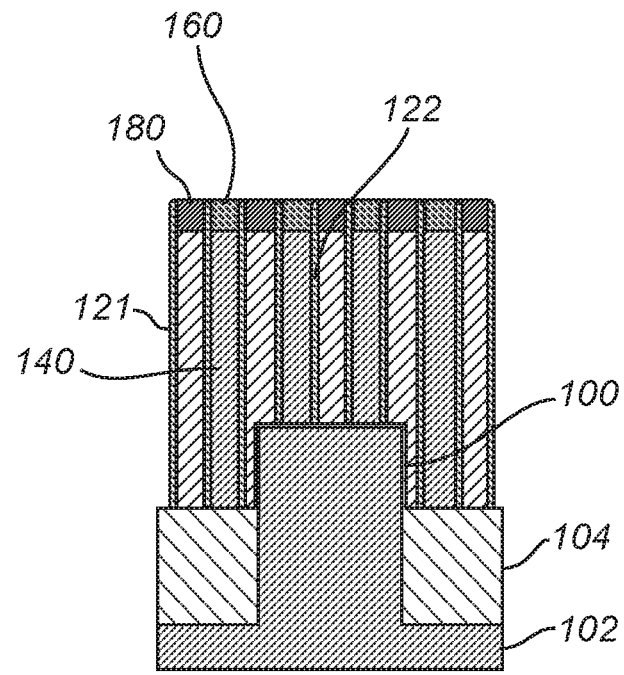
Figure 9C:
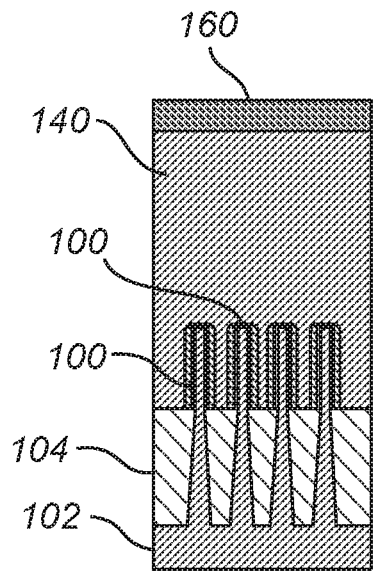
Figure 9D:
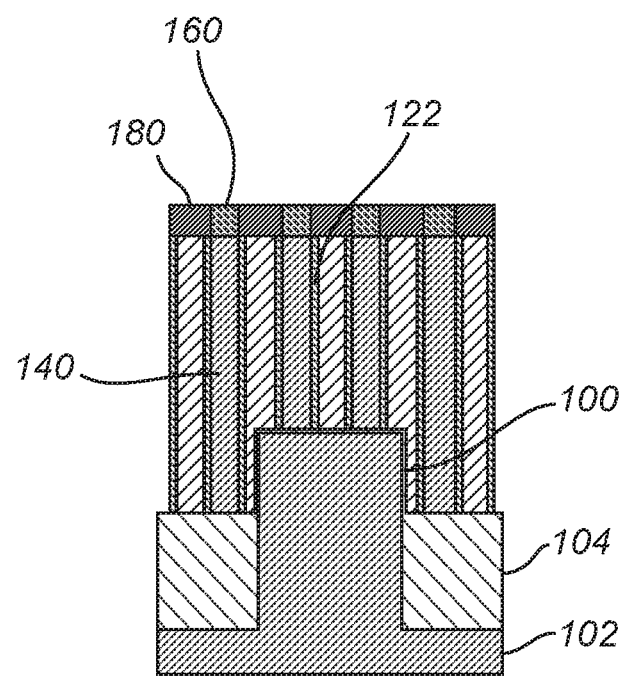

FIGS. 9a to 9d show the structure after a mask layer material 180 has been provided between the sacrificial mask lines. The mask layer material 180 may be formed of silicon nitride, and may be provided in a recess filling process preferably followed by a CMP that stops on the material of the sacrificial mask lines. FIGS. 9a and 9b show the mask layer material 180 covering the underlying first set of spacers 121, 122, whereas FIGS. 9c and 9d show the alternative flow in which the mask layer material 180 also covers the underlying second set of spacers 131, 132, 133, 134.

Figure 10A:
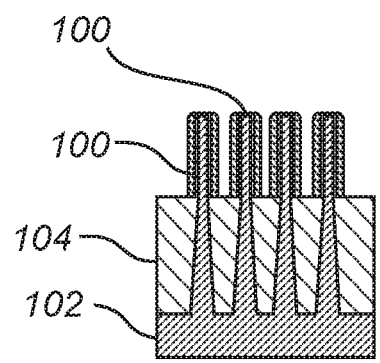
Figure 10B:
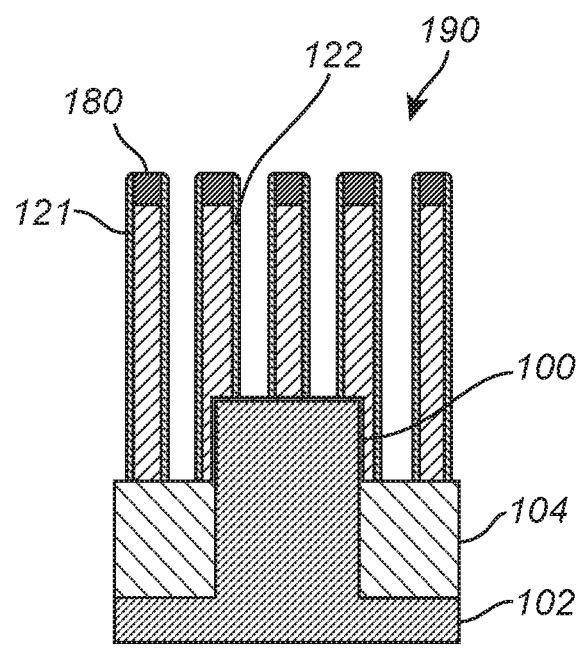
Figure 10C:
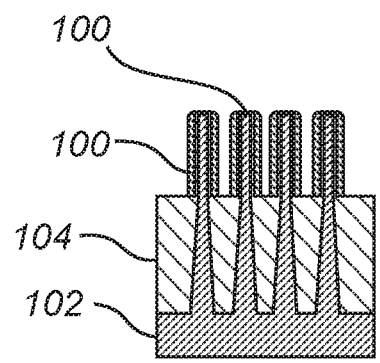
Figure 10D:
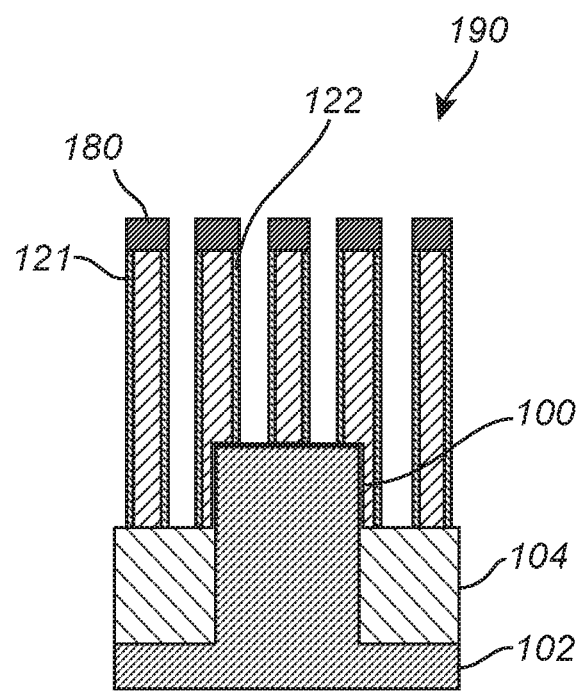

FIGS. 10a to 10d show the mask layer 190 after the sacrificial mask lines have been removed together with the first filler material 140. In FIGS. 10a and 10b, the mask layer 190 is formed of the mask layer material 180 and the second set of spacers 131, 132, 133, 134, wherein the mask layer material 180 covers the underlying first set of spacers 121, 122. In FIGS. 10c and 10d, the mask layer 190 is formed of the mask layer material 180 covering both the first set of spacers 121, 122 and the second set of spacers 131, 132, 133, 134.

By removing the first filler material in the gaps defined between the second set of spacers, the mask layer 190 may be ready for a subsequent replacement gate process for contacting the fin structures exposed in the gaps. This may include the formation of a sacrificial structure of for example oxide or nitride in place of the metal gate during high-temperature steps. After completion of those steps, which for example may include source/drain implant activation anneals, the sacrificial structure may be etched away, a gate dielectric grown or deposited, and the final metal gate deposited in the gate tracks defined between the spacers of the second set of spacers In the above the disclosed technology has mainly been described with reference to a limited number of examples. However, as is readily appreciated by a person skilled in the art, other examples than the ones disclosed above are equally possible within the scope of the disclosed technology, as defined by the appended claims.

What is claimed is:

1. A method of forming a mask layer above a semiconductor fin structure, the method comprising:
   forming a mandrel above the fin structure;
   providing a first spacer material on the mandrel, thereby forming a first set of spacers including a first spacer at a first side surface of the mandrel and a second spacer at a second side surface of the mandrel;
   removing the mandrel from between the first spacer and the second spacer;
   providing a second spacer material on the first and the second spacers after removing the mandrel, thereby forming a second set of spacers arranged at the side surfaces of the first set of spacers;

providing a first filler material between the second set of spacers;

etching a top portion of the first filler material to form first recesses between the second set of spacers;

providing a second filler material in the first recesses between the second set of spacers, the second filler material forming a set of sacrificial mask lines;

recessing a top portion of at least the first set of spacers, wherein recessing the top portion of the at least the first set of spacers comprises forming second recesses between the sacrificial mask lines;

providing a mask layer material in the second recesses between the sacrificial mask lines; and providing a mask layer material in the recesses between the sacrificial mask lines; and removing the sacrificial mask lines and the first filler material.

2. The method of claim 1, wherein the mandrel is formed by a spin-on process.

3. The method of claim 1, wherein the mandrel comprises a carbon material.

4. The method of claim 1, wherein providing the first spacer material comprises depositing using an atomic layer deposition process.

5. The method of claim 4, wherein the first spacer material comprises amorphous silicon.

6. The method of claim 1, wherein providing the first spacer material is followed by an etch-back process to remove the first spacer material from the fin structure.

7. The method of claim 1, wherein the second spacer material comprises a dielectric material.

8. The method of claim 7, wherein the dielectric material comprises silicon nitride.

9. The method of claim 7, wherein providing the second spacer material is followed by an etch-back process to remove the second spacer material from the fin structure.

10. The method of claim 1, wherein the first filler material comprises a spin-on carbon material.

11. The method of claim 1, further comprising recessing a top portion of the second set of spacers prior to providing the mask layer material between the sacrificial mask lines.

12. The method of claim 1, wherein the second filler material comprises silicon dioxide.

13. The method of claim 1, wherein the mask layer material comprises silicon dioxide or hafnium dioxide.

14. The method of claim 1, further comprising planarizing the mask layer material to form a mask layer.

15. The method of claim 14, wherein planarizing comprises chemical-mechanical polishing.

16. The method of claim 15, wherein the chemical-mechanical polishing is performed until the mask layer is a substantially planar surface with the sacrificial mask lines.

17. The method of claim 1, wherein providing the mask layer material comprises providing the mask layer material over a bottom portion of the at least the first set of spacers.

* * * * *

UNITED STATES PATENT AND TRADEMARK OFFICE
CERTIFICATE OF CORRECTION

PATENT NO. : 11,430,697 B2
APPLICATION NO. : 16/843706
DATED : August 30, 2022
INVENTOR(S) : Boon Teik Chan It is certified that error appears in the above-identified patent and that said Letters Patent is hereby corrected as shown below:

In the Specification

In Column 8, Line 47, delete "spacers" and insert --spacers.--.

In the Claims

In Column 9, Claim 1, Lines 13-14 (Approx.), below "lines; and", delete "providing a mask layer material in the recesses between the sacrificial mask lines; and".

Signed and Sealed this
Thirteenth Day of December, 2022

Katherine Kelly Vidal
*Director of the United States Patent and Trademark Office*